United States Patent
Wieduwilt et al.

(10) Patent No.: US 11,069,426 B1
(45) Date of Patent: Jul. 20, 2021

(54) MEMORY DEVICE WITH A ROW REPAIR MECHANISM AND METHODS FOR OPERATING THE SAME

(71) Applicant: Micron Technology, Inc., Boise, ID (US)

(72) Inventors: Christopher G. Wieduwilt, Boise, ID (US); James S. Rehmeyer, Boise, ID (US); Seth A. Eichmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/796,511

(22) Filed: Feb. 20, 2020

(51) Int. Cl.
 G11C 29/00 (2006.01)
 G11C 11/408 (2006.01)
 G11C 11/406 (2006.01)

(52) U.S. Cl.
 CPC ........ *G11C 29/789* (2013.01); *G11C 11/4087* (2013.01); *G11C 29/787* (2013.01); *G11C 11/40615* (2013.01)

(58) Field of Classification Search
 CPC .. G11C 11/4087; G11C 29/789; G11C 29/787
 USPC ............................................. 365/200, 230.06
 See application file for complete search history.

(56) References Cited

U.S. PATENT DOCUMENTS

| | | | | |
|---|---|---|---|---|
| 6,104,648 | A * | 8/2000 | Ooishi | G11C 7/1006 365/200 |
| 6,320,800 | B1 * | 11/2001 | Saito | G11C 8/06 365/189.19 |
| 6,388,925 | B1 * | 5/2002 | Kim | G11C 29/808 365/200 |
| 9,418,762 | B1 * | 8/2016 | You | G11C 29/787 |
| 9,514,849 | B2 * | 12/2016 | You | G11C 29/76 |

* cited by examiner

*Primary Examiner* — Son L Mai
(74) *Attorney, Agent, or Firm* — Perkins Coie LLP

(57) ABSTRACT

Methods, apparatuses and systems related to managing access to a memory device are described. A memory device includes a plurality of banks that each include (1) a plurality of memory cells and (2) a plurality of redundant cells configured to replace one or more target memory cells in the plurality of memory cells. A set of shared fuses and latches may be used to store a row address for each repair that may be implemented in one of the plurality of banks. A shared match circuit coupled to the set of shared latches and the plurality of memory banks may be configured to at least partially implement a row repair for the row address for a bank associated with a commanded operation.

25 Claims, 7 Drawing Sheets

MEMORY DEVICE WITH A ROW REPAIR MECHANISM AND METHODS FOR OPERATING THE SAME

TECHNICAL FIELD

The disclosed embodiments relate to devices, and, in particular, to semiconductor memory devices with a row repair mechanism and methods for operating the same.

BACKGROUND

Memory devices can include semiconductor circuits configured to utilize electrical energy to store and access information. Some examples of the memory devices include a volatile memory device, a non-volatile memory device, or a combination device.

Some memory devices (e.g., random-access memory (RAM), such as dynamic RAMs (DRAMs)) may include circuits configured to repair bit fails. FIG. 1 is a partial block diagram of a memory device 100 including a set of repairable memory cells. The memory device 100 includes repair circuit coupled to and/or integral with memory cells 102 and configured to repair/replace one or more defective cells 104 within the corresponding set of memory cells 102. The memory cells 102 include repair or redundant cells that are designated to replace the defective cells 104 as part of the repair circuit. In other words, the repair cells are configured to be back up memory cells that are not utilized in normal operations unless they are used to replace the actual/main memory cells 102. The repair cells are arranged in rows and columns (as, e.g., redundant rows 112 and redundant columns 114) similarly to the other memory cells 102.

In replacing the defective cells 104, the memory device 100 may implement row repairs and/or column repairs. For row repairs, the memory device 100 may deploy and utilize the redundant rows 112 to replace rows including the defective cells 104. As illustrated in FIG. 1, the memory device 100 may replace row R0, which contains the defective cell 104 therein, with a redundant row RR0. For column repairs, the memory device 100 may deploy and utilize the redundant columns 114 to replace columns including the defective cells 104. As illustrated in FIG. 1, the memory device 100 may replace column C0, which contains the defective cell 104 therein, with a redundant column RC1.

The repair circuit includes fuse blocks configured to facilitate the memory cell replacements. Each of the blocks that include a set of fuse latches is directly coupled (i.e., one-to-one dedicated and fixed electrical and functional connection) to a redundant row or a redundant column. The memory device 100 includes fuses or non-volatile memory (not shown) located in a fuse array on die. The information stored in the fuse array is broadcasted at initialization and loaded into the fuse blocks in each bank.

As illustrated in FIG. 1, the fuse blocks include row fuse blocks 122 that are each directly coupled to one of the redundant rows 112 and column fuse blocks 124 that are each directly coupled to one of the redundant columns 114. Each fuse block is configured to store addresses of the row/column including the defective cells 104. For example, when a redundant column is used to replace a defective column, the fuse block for the corresponding redundant column may be programmed (via, e.g., blowing/setting the fuse latches and/or associated fuses) to store the address of the defective column. The defective column can be effectively removed from operations of the memory device 100. Subsequently, the redundant column is used to store and provide access to data in place of the replaced defective column.

DETAILED DESCRIPTION

As described in greater detail below, the technology disclosed herein relates to an apparatus, such as a memory device, a memory system, a system with one or more memory devices, related methods, etc., for repairing memory cells. The apparatus includes a shared logic circuit that controls repair operations (e.g., row repairs) for a set of multiple banks. In some embodiments, each shared logic circuit can include a set of fuses/latches and a control circuit used to control repairs for a plurality of banks. The set of fuses/latches can be used to store a bank address along with a latched row address for each repair. The shared logic circuit can include a bank selection circuit configured to apply/direct the repair to one of the banks indicated by the bank address.

Conventional devices have repair fuse latch sets directly hard wired (i.e., dedicated one-to-one electrical and functional connections) to corresponding redundant memory cells. Accordingly, repair capabilities of such conventional devices are limited by the worst-performing repair region (e.g., portions within a memory array). Because of the unpredictability in failure, the repair fuse latch sets are included for every redundant element, such as for every redundant column and every redundant row, on the die.

In contrast, for the embodiments described below, repairs may be assigned to different rows or columns within a group of memory cells, such as across a bank. To assign the repair cells, the apparatus can include the shared logic circuit that can decode bank address (BA) and/or bank group (BG). While the shared logic circuit is shared between multiple row elements, the match circuit can still be repurposed to point to any of the remaining bank addresses if a redundant row is defective in one bank. Moreover, since the fuses/latches can be shared between multiple banks, the apparatus can reduce the overall circuit size. Further, the apparatus can reduce or eliminate scenarios where a bad redundant in one bank causes loss of matching redundant resources in all banks that duplicate repair, such as for row repairs. For example, the shared logic circuit can connect repairs to individual banks, thereby preventing one defective redundant row from eliminating multiple (e.g., four) potential repairs.

Figure 2:
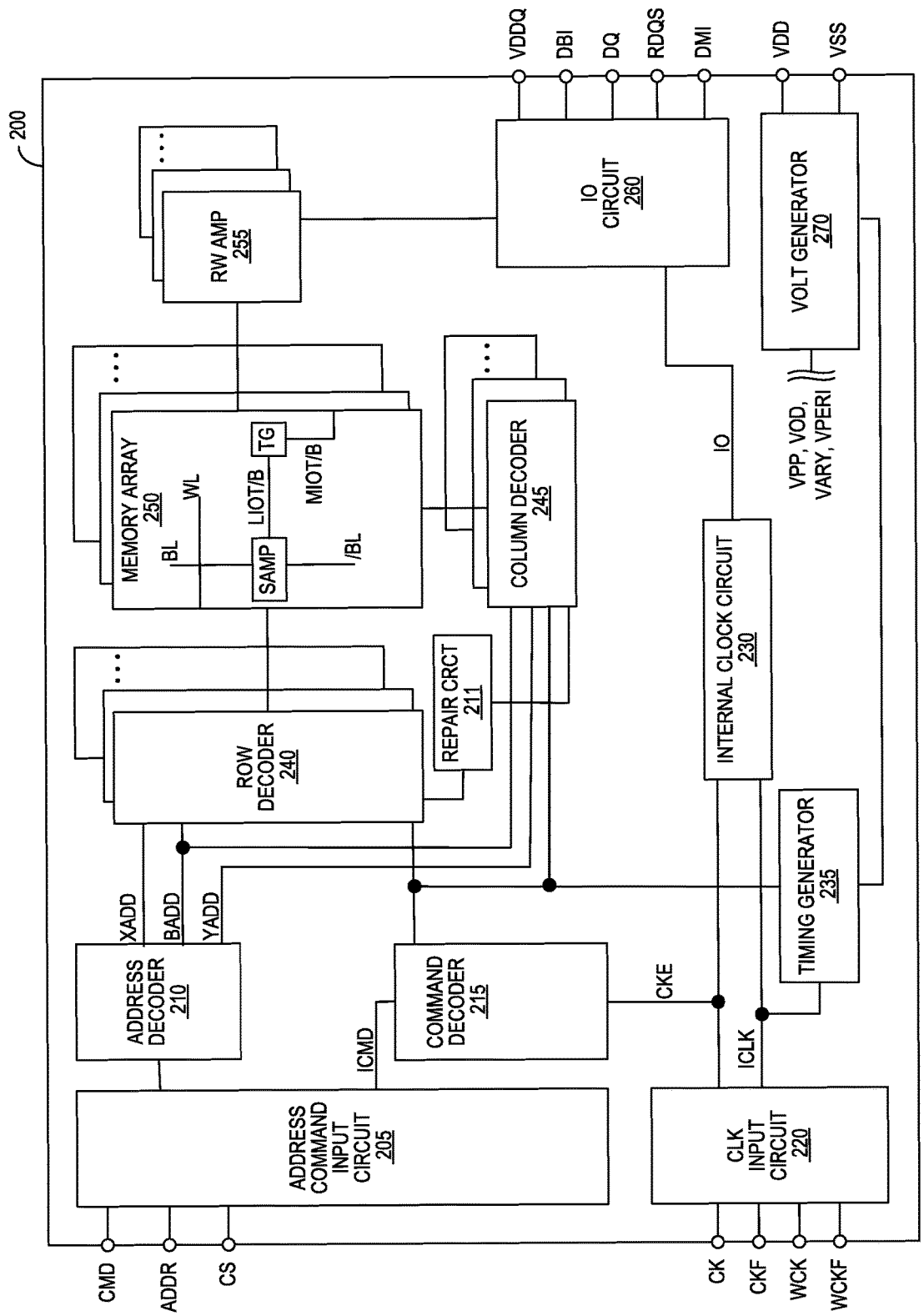
FIG. 2 is a block diagram of an example memory device in accordance with an embodiment of the present technology.

FIG. 2 is a block diagram of an example memory device 200 (e.g., a semiconductor die assembly, including a three-dimensional integration (3DI) device or a die-stacked package) in accordance with an embodiment of the present technology. For example, the memory device 200 can include a DRAM or a portion thereof that includes one or more dies/chips.

The memory device 200 may include an array of memory cells, such as memory array 250. The memory array 250 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 240, and the selection of a bit line BL may be performed by a column decoder 245. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 250 may also include plate lines and corresponding circuitry for managing their operation.

The memory device 200 may employ a plurality of external terminals that include command and address terminals coupled to a command bus and an address bus to receive command signals (CMD) and address signals (ADDR), respectively. The memory device 200 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 2) from outside. The address signal and the bank address signal supplied to the address terminals can be transferred, via a command/address input circuit 205, to an address decoder 210. The address decoder 210 can receive the address signals and supply a decoded row address signal (XADD) to the row decoder 240, and a decoded column address signal (YADD) to the column decoder 245. The address decoder 210 can also receive the bank address signal and supply the bank address signal to both the row decoder 240 and the column decoder 245.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the memory device 200 to respond to commands and addresses provided to the command and address terminals. When an active chip select signal is provided to the memory device 200, the commands and addresses can be decoded and memory operations can be performed. The command signals may be provided as internal command signals ICMD to a command decoder 215 via the command/address input circuit 205. The command decoder 215 may include circuits to decode the internal command signals ICMD to generate various internal signals and commands for performing memory operations, for example, a row command signal to select a word line and a column command signal to select a bit line. The command decoder 215 may further include one or more registers for tracking various counts or values (e.g., counts of refresh commands received by the memory device 200 or self-refresh operations performed by the memory device 200).

Read data can be read from memory cells in the memory array 250 designated by row address (e.g., address provided with an active command) and column address (e.g., address provided with the read). The read command may be received by the command decoder 215, which can provide internal commands to input/output circuit 260 so that read data can be output from the data terminals DQ, RDQS, DBI, and DMI via read/write amplifiers 255 and the input/output circuit 260 according to the RDQS clock signals. The read data may be provided at a time defined by read latency information RL that can be programmed in the memory device 200, for example, in a mode register (not shown in FIG. 2). The read latency information RL can be defined in terms of clock cycles of the CK clock signal. For example, the read latency information RL can be a number of clock cycles of the CK signal after the read command is received by the memory device 200 when the associated read data is provided.

Write data can be supplied to the data terminals DQ, DBI, and DMI according to the WCK and WCKF clock signals. The write command may be received by the command decoder 215, which can provide internal commands to the input/output circuit 260 so that the write data can be received by data receivers in the input/output circuit 260, and supplied via the input/output circuit 260 and the read/write amplifiers 255 to the memory array 250. The write data may be written in the memory cell designated by the row address and the column address. The write data may be provided to the data terminals at a time that is defined by write latency WL information. The write latency WL information can be programmed in the memory device 200, for example, in the mode register. The write latency WL information can be defined in terms of clock cycles of the CK clock signal. For example, the write latency information WL can be a number of clock cycles of the CK signal after the write command is received by the memory device 200 when the associated write data is received.

The power supply terminals may be supplied with power supply potentials VDD and VSS. These power supply potentials VDD and VSS can be supplied to an internal voltage generator circuit 270. The internal voltage generator circuit 270 can generate various internal potentials VPP, VOD, VARY, VPERI, and the like based on the power supply potentials VDD and VSS. The internal potential VPP can be used in the row decoder 240, the internal potentials VOD and VARY can be used in the sense amplifiers included in the memory array 250, and the internal potential VPERI can be used in many other circuit blocks.

The power supply terminal may also be supplied with power supply potential VDDQ. The power supply potential VDDQ can be supplied to the input/output circuit 260 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 260 so that power supply noise generated by the input/output circuit 260 does not propagate to the other circuit blocks.

The clock terminals and data clock terminals may be supplied with external clock signals and complementary external clock signals. The external clock signals CK, CKF, WCK, WCKF can be supplied to a clock input circuit 220. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 220 can receive the external clock signals. For example, when enabled by a clock/enable signal from the command decoder 215, an input buffer can receive the clock/enable signals. The clock input circuit 220 can receive the external clock signals to generate internal clock signals ICLK. The internal clock signals ICLK can be supplied to an internal clock circuit 230. The internal clock circuit 230 can provide various phase and frequency controlled internal clock signals based on the received internal clock signals ICLK and a clock enable (not shown in FIG. 2) from the command/address input circuit 205. For example, the internal clock circuit 230 can include a clock path (not shown in FIG. 2) that receives the internal clock signal ICLK and provides various clock signals to the command decoder 215. The internal clock circuit 230 can further provide input/output (IO) clock signals. The IO clock signals can be supplied to the input/output circuit 260 and can be used as timing signals for determining output timing of read data and/or input timing of write data. The IO clock signals can be provided at multiple clock frequencies so that data can be output from and input to the memory device 200 at different data rates. A higher clock frequency may be desirable when high memory speed is desired. A lower clock frequency may be desirable when lower power consumption is desired. The internal clock signals ICLK can also be supplied to a timing generator 235 and thus various internal clock signals can be generated.

The memory device 200 can be connected to any one of a number of electronic devices capable of utilizing memory for the temporary or persistent storage of information, or a component thereof. For example, a host device of memory device 200 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 200; although in other embodiments, the host device may be indirectly connected to memory device (e.g., over a networked connection or through intermediary devices).

The memory device 200 can include repair circuit 211, which can be coupled to one or more address decoders, such as the address decoder 210, the row decoder 240, and/or the column decoder 245. The repair circuit 211 can be configured to repair defects in storage cells. For example, the repair circuit 211 can replace defective memory cells with redundant memory cells in the memory array 250. As described in further detail below, the repair circuit 211 can include shared local fuse latches configured to store location information (e.g., addresses and/or status/enable information) associated with the defective memory cell within a group of two or more banks. The repair circuit 211 can further include a shared match circuit that implements the repairs, such as by detecting conditions associated with replacing defective memory cells with redundant memory cells, for the group of two or more banks. The shared match circuit can include a bank selection circuit that directs one or more detection outputs according to a bank address. In other words, the repair circuit 211 can include one grouping of repairs, fuses, and/or latches for each grouping of the two or more banks instead of one grouping of repairs, fuses, and/or latches for each bank. Thus, the number of repairs, fuses, and/or fuse latches may be reduced to account for realistic failure rates, thereby reducing resources and/or device footprint associated with the repairs, fuses, latches, etc.

Figure 3A:
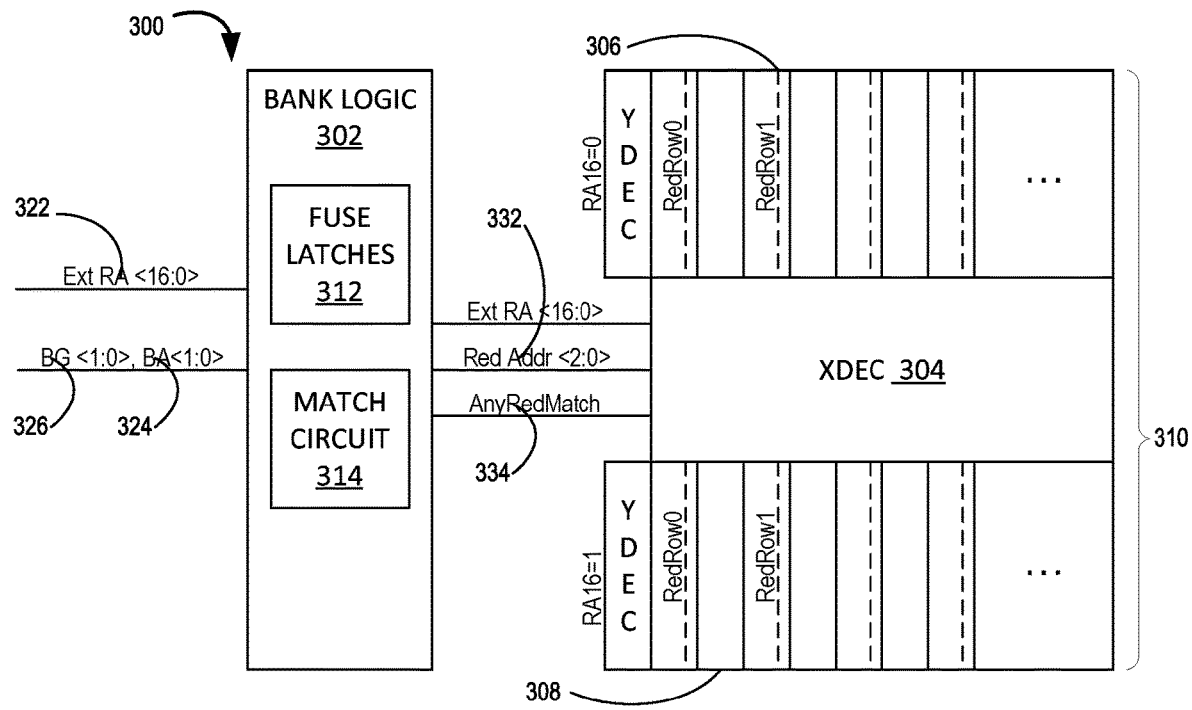
FIG. 3A is a block diagram of a portion of the memory device of FIG. 2 in accordance with an embodiment of the present technology.

FIG. 3A is a block diagram of a portion of the memory device of FIG. 2 (e.g., a first repair circuit 300) in accordance with an embodiment of the present technology. The first repair circuit 300 can correspond to a portion of the repair circuit 211 of FIG. 2 that controls repairs for a bank 310 within the memory array 250 of FIG. 2. For example, the first repair circuit 300 can include a bank logic 302 that is operably coupled to a row decoder 304 (e.g., a portion of the row decoder 240 of FIG. 2) and control repairs for a first memory grouping 306 and a second memory grouping 308 in the bank 310. In some embodiments, the first memory grouping 306 and the second memory grouping 308 can each include 64 sections, 64,000 rows, and/or 64 or 128 redundant/repair rows per bank.

The bank logic 302 may include a set of fuse latches 312 and a match circuit 314 configured to control the repairs according to an external row address (RA) 322 (e.g., a row address associated with a read/write command), an external bank address (BA) 324, and/or a bank group (BG) identifier 326. The bank logic 302 can generate a redundant address 332 and/or a redundant match flag 334 based on the external RA 322, the external BA 324, and/or the BG identifier 326.

Figure 3B:
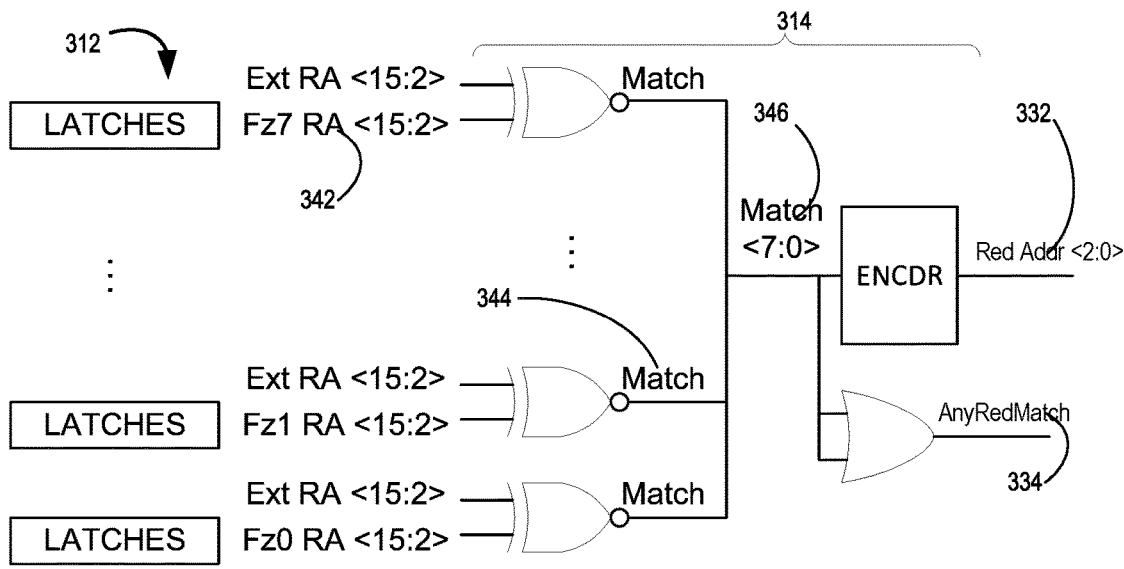
FIG. 3B is a detailed block diagram of a bank logic in accordance with an embodiment of the present technology.

For illustrating details of the bank logic 302, FIG. 3B is a detailed block diagram of a bank logic in accordance with an embodiment of the present technology. The bank logic 302 may include one row match circuit and/or one repair fuse set per each row repair in each bank. For example, each row match circuit (e.g., an XNOR device) can receive and compare the external RA 322 (ExtRA <16:0>) or a portion thereof (ExtRA <15:2>) and a latched row address 342 (Fz$_n$RA <15:2>) from a repair fuse set for a corresponding repair (n) out of the eight available repairs (n=0, 1, . . . , 7). Based on the comparison, each row match circuit can generate a row match flag 344 that represent whether the external RA 322 matches the corresponding latched row address 342 (e.g., a representation of a defective row). The row match flags 344 can be combined as a combined match output 346 (Match <7:0>) that is provided to an encoder (e.g., an 8:3 encoder) and/or a detection circuit (e.g., an OR device). Accordingly, the encoder can generate the redundant address 332 (RedAddr <2:0>) and the detection circuit can generate the redundant match flag 334 (AnyRedMatch)

based on the combined match output 346. The redundant address 332 can indicate an instance or a location of the redundant row used to replace the latched row address 342, and the redundant match flag 334 can indicate whether any of the latched row addresses 342 matched the external RA 322 (ExtRA <16:0>). When the external RA 322 matches one of the latched row addresses 342, as indicated by the redundant match flag 334, the row decoder 304 can access the redundant row instead of the row indicated by the external RA 322.

Figure 4A:
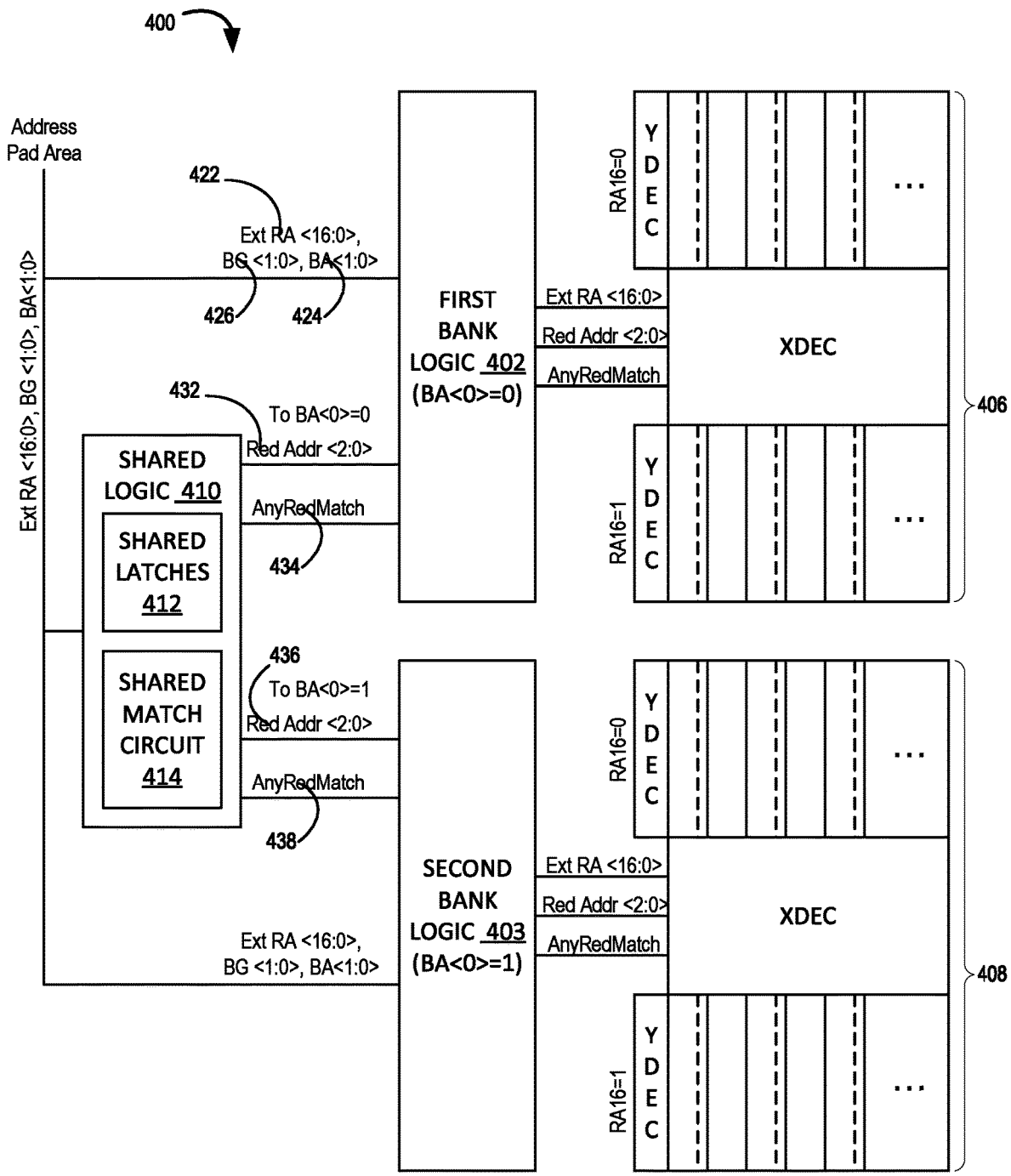
FIG. 4A is a block diagram of a portion of the memory device of FIG. 2 in accordance with an embodiment of the present technology.

FIG. 4A is a block diagram of a portion of the memory device 200 of FIG. 2 (e.g., a second repair circuit 400) in accordance with an embodiment of the present technology. The second repair circuit 400 can correspond to a portion of the repair circuit 211 of FIG. 2 that controls repairs for a set of banks (including e.g., a first bank 406, a second bank 408, and/or others) within the memory array 250 of FIG. 2. For example, the second repair circuit 400 can include a first bank logic 402 and a second bank logic 403 that are each operably coupled to a corresponding portion of the row decoder 240 of FIG. 2. In some embodiments, each of the first bank 406 and the second bank 408 can include multiple memory groupings. For example, the first bank 406 and the second bank 408 can each include two memory groupings similar to the first memory grouping 306 of FIG. 3A and the second memory grouping 308 of FIG. 3A. In some embodiments, each of the memory groupings can include 64 sections, 64,000 rows, and/or eight redundant/repair rows.

The first bank logic 402 and the second bank logic 403 can interface with the row decoder to implement the repair according to processing results from a shared logic 410. The shared logic 410 can include a circuit configured to control repairs (e.g., row repairs) for a group of banks (e.g., the first bank 406, the second bank 408, and/or other groupings of memory circuits). The shared logic 410 can receive an external row address (RA) 422 (e.g., a row address associated with a read/write command). The shared logic 410 can also receive a bank address (BA) identifier 424 and/or a bank group (BG) identifier 426 that identify a memory bank that corresponds to the external RA 422. In other words, the shared logic 410 can receive the external RA 422, the External BA 424, and/or the BG identifier 426 that identify a set of memory cells targeted by a command (e.g., an activate command).

The shared logic 410 can process the received information to determine whether the targeted memory cells have been determined as being defective and/or as being subject to a repair. In other words, the shared logic 410 can determine whether the received information matches location information stored in the fuse latches. The shared logic 410 can generate results that represent the processing results. For example, the shared logic 410 can generate one or more redundant addresses (e.g., a first redundant address 432 for the first bank 406 and/or a second redundant address 436 for the second bank 408) that identify the redundant memory configured to replace the memory cells (e.g., the defective cells) targeted by the read/write operation. Also, the shared logic 410 can generate one or more flags (e.g., a first active-repair flag 434 for the first bank 406 and/or a second active-repair flag 438 for the second bank 408) that indicate whether the location information for the activate command matches at least one latched location information. In other words, the active-repair flags can indicate whether a repair row should be accessed instead of a targeted row for the corresponding bank.

Figure 4B:
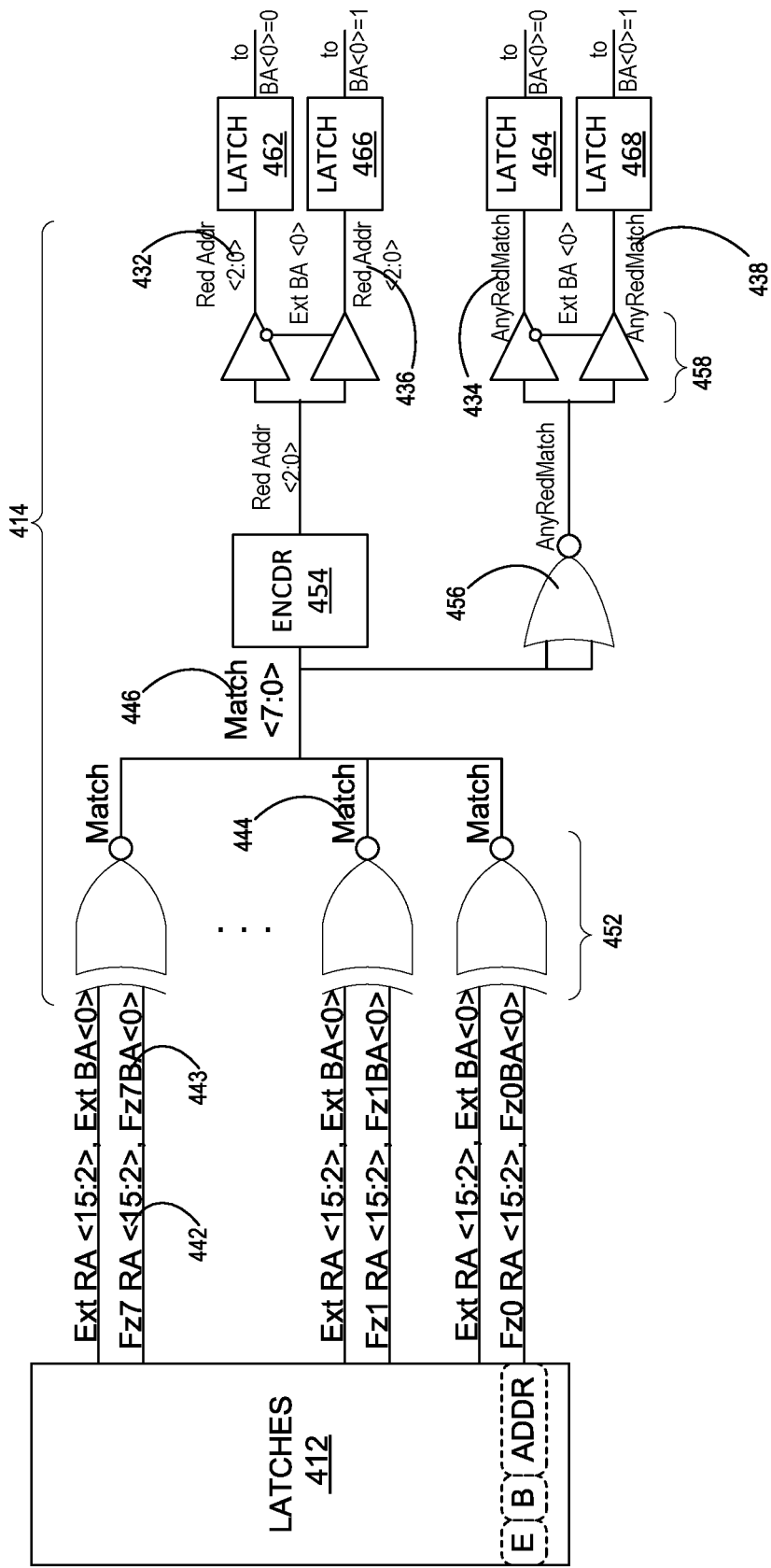
FIG. 4B is a detailed block diagram of a shared logic in accordance with an embodiment of the present technology.

In illustrating details of an example of the shared logic 410, FIG. 4B is a detailed block diagram of a shared logic in accordance with an embodiment of the present technology. The shared logic 410 can include shared latches 412 configured to store latched row addresses 442 (Fz$_n$RA <15:2>) for the repairs. For example, the shared latches 412 can include eight latch sets (n=0, 1, . . . 7) for eight possible repairs. Each latch set can store an address of a defective row for one repair. The shared latches 412 can also store a latched bank address 443 (Fz$_n$BA<0>) that indicates the bank associated with each of the repairs. In other words, the latched bank address 443 can identify the bank, from within the grouping of banks, that includes the defective memory cells designated for replacement/repair. In some embodiments, the shared logic may include 1,000 or more address latches.

The shared logic 410 can also include a shared match circuit 414 configured to compare the latched RA 442 to the external RA 422 (ExtRA <16:0>) or a portion thereof (ExtRA <15:2>). The shared match circuit 414 can include row match circuits 452 (e.g., XNOR devices or XOR devices) that each compare the latched RA 442 and the latched BA 443 to the external RA 422 and the External BA 424. For the example illustrated in FIG. 4B, the shared match circuit 414 can include eight instances of the row match circuits 452 (e.g., one for each repair) that each determine whether the corresponding latched location information match the bank/row information targeted by the activate operation. Each row match circuit 452 can generate a row match flag 444 that represents whether the activate operation is targeting the memory cells indicated by the corresponding fuse latch set and designated for the corresponding repair. Accordingly, each row match circuit 452 can be used to service multiple banks instead of being hard wired to a specific element/bank. In some embodiments, the shared match circuit 414 can include over 100 (e.g., 100-300) row match circuits 452. Also, in some embodiments, the row match circuits 452 may be implemented via a non-CMOS XNOR logic that precharges the row match flag 444 high and pulls the flag low if addresses do not match.

The row match flag 444 from the each of the row match circuits 452 may be combined as a combined match output 446 (Match <7:0>) and provided to an encoder 454 and/or a repair detection circuit 456. The encoder 454 (e.g., an 8:3 encoder) may be configured to encode the combined match output 446 and generate an internal row address (RedAddr<2:0>) that indicates a set of redundant memory cells that correspond to the repair (e.g., matched to the defective memory cells). The repair detection circuit 456 (e.g., a NOR device) may be configured to generate an internal match flag (AnyRedMatch) that indicates that the external RA 422 and the External BA 424 matches a set of memory cells indicated to repair. In other words, the internal match flag can indicate that a redundant row should be accessed instead of the memory cells (e.g., the defective memory cells) indicated by the activate operation.

The shared match circuit 414 can include a bank selection circuit 458 (e.g., multiplexors, sets of tri-state buffers, and/or sets of high-Z buffers) configured to generate the internal row address and/or the internal match flag according to the External BA 424. The bank selection circuit 458 can use the internal row address to generate the first redundant address 432 for the first bank 406 or the second redundant address 436 for the second bank 408 according to the External BA 424. The bank selection circuit 458 can also use the internal match flag to generate the first active-repair flag 434 for the first bank 406 or the second active-repair flag 438 for the second bank 408 according to the External BA 424. In other words, the bank selection circuit 458 can repeat one of the addresses and/or one of the match flags for one bank, thereby utilizing the shared latches to control/identify specific to one of multiple banks instead of duplicating repairs across the grouped banks. Accordingly, a defective redundant in one bank may be isolated from affecting corresponding repairs in other banks within the grouping.

In one or more embodiments, the memory device 200 may include a set of latches configured to temporarily store (e.g., latch) the generated addresses and/or flags before communicating the signals to the corresponding locations (e.g., banks). For example, the memory device 200 may include a first address latch 462 for storing the first redundant address 432, a first flag latch 464 for storing the first active-repair flag 434, a second address latch 464 for storing the second redundant address 436, and/or a second flag latch 468 for storing the second active-repair flag 438. The set of latches may be included in the bank logic (e.g., the first and/or the second banks 402 and/or 403) and/or the shared logic 410 (e.g., after the shared match circuit 414). The shared match circuit 414 may be configured to generate the Red Addr and/or AnyRedMatch signals in response to each activate command. However, the banks may still require access to preceding results (e.g., the Red Addr and/or AnyRedMatch signals, such as due to the shared configuration). As such, the set of latches may temporarily store the preceding results for continuing access by the banks. The set of latches may be cleared or reset when precharging the corresponding bank.

In some embodiments, the memory device 200 may be configured to duplicate repairs across multiple banks. The memory device 200 (e.g., the shared match circuit 414, corresponding fuses/latches, etc.) can be configured without and/or to ignore the latched bank address 443 (BA<0>). In one or more embodiments, the latched bank address 443 may not be stored in the shared latches 412. The shared match circuit 414 can process the latched bank address 443 as described above without comparing the latched bank address 443 to the activate command. Accordingly, the shared match circuit 414 can process the activate command according to the External BA 424 (BA<0>) therein, such as for steering the data to the targeted locations.

Figure 5:
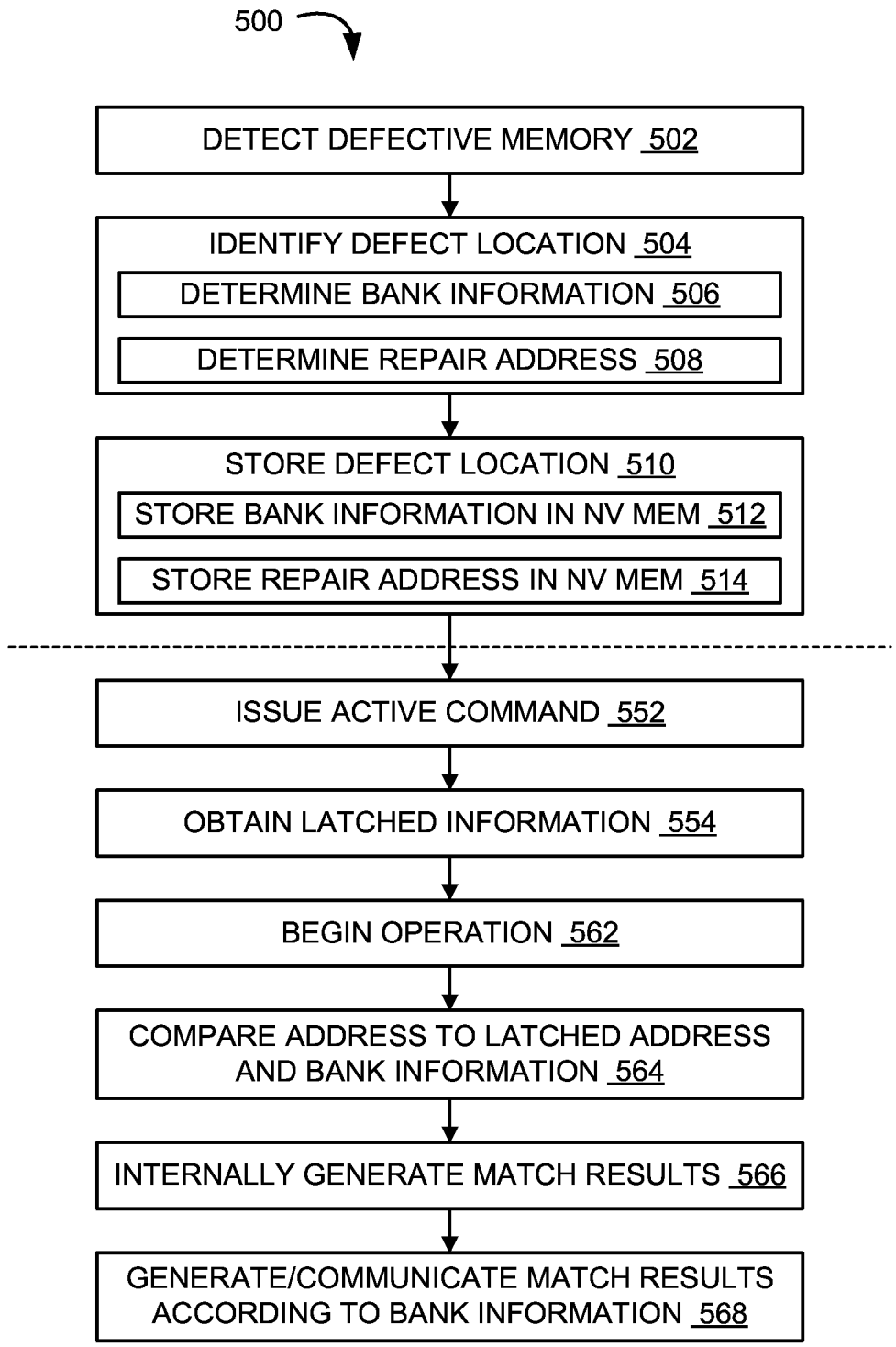
FIG. 5 is a flow diagram illustrating an example method of operating an apparatus in accordance with an embodiment of the present technology.

FIG. 5 is a flow diagram illustrating an example method 500 of operating an apparatus (e.g., the memory device 200 of FIG. 2) in accordance with an embodiment of the present technology. For example, the method 500 can be for operating the second repair circuit 400 of FIG. 4A, the shared latches 412 of FIG. 4A, and/or the shared match circuit 414 of FIG. 4A for replacing one or more defective memory cells with redundant memory cells. The method 500 can effectively or functionally couple (i.e., without or in place of direct one-to-one connections) the fuses and/or the fuse latches for repairs across a set of grouped banks (e.g., the first bank 406 of FIG. 4A and the second bank 408 of FIG. 4A). For example, the method 500 can be for implementing row repairs for the set of grouped banks using the shared latches 412 and the shared match circuit 414.

Figure 1:
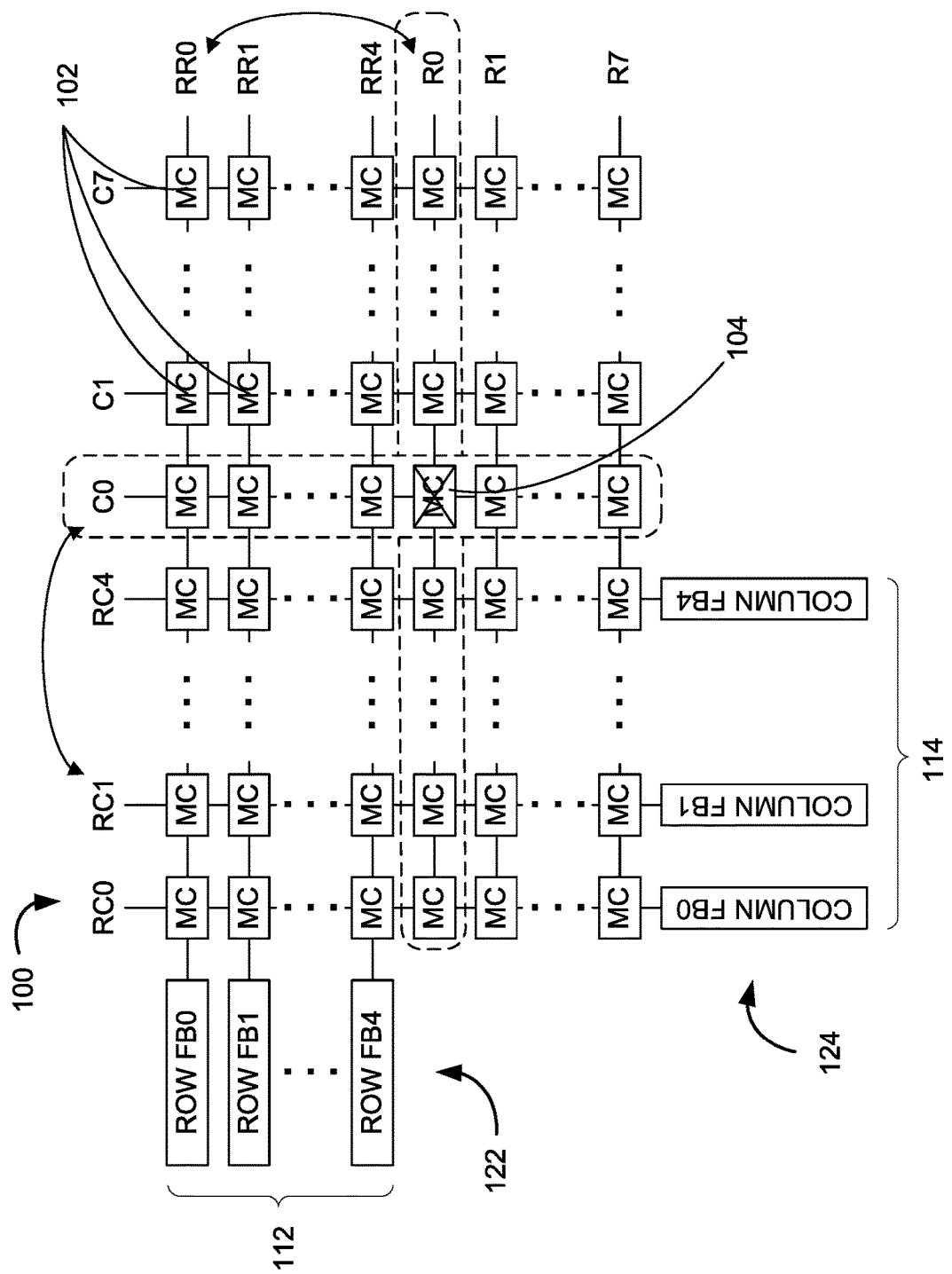
FIG. 1 is a partial block diagram of a memory device including a set of repairable memory cells.

At block 502, the memory device 200 can detect defective memory (e.g., the defective cells 104 of FIG. 1). In some embodiments, the memory device 200 can implement a built-in self-test (BIST), which can be on-line and/or off-line, to test the memory cells (e.g., rows within the memory array 250 of FIG. 2). For example, the memory device 200 can execute a test sequence (via, e.g., a memory controller, a finite state machine, and/or a processor) using a predetermined sequence of test elements that include memory operations, data patterns, and/or addresses. The memory device 200 may also connect to an external test sequence (e.g., an external tester). The tester can provide commands, conditions, and/or environment, to the memory device 200. To test, the memory device 200 can write the predetermined data patterns to the corresponding addresses and then read the same addresses to confirm the same data pattern. When the read pattern does not match the predetermined written data pattern, the memory device 200 can identify the memory cells (e.g., one or more rows) corresponding to the difference as being defective.

At block 504, the memory device 200 can identify the defect location (e.g., the bank and/or row locations of the defective memory cells). For example, the memory device 200 can determine a bank identifier and an internal address (e.g., a row address within the bank) that locates/identifies the row the within the memory array 250 that includes the one or more defective memory cells. The memory device 200 can identify the bank identifier and the internal row address based on the test results according to a predetermined process.

At block 506, the memory device 200 can determine bank information (e.g., the bank identifier that corresponds to the latched BA 443 of FIG. 4A) that identifies/locates the bank, such as from within a bank grouping, having the one or more defective memory cells. At block 508, the memory device 200 can determine a repair address (e.g., the address of a row in the bank) for the defective memory cells. The repair address can correspond to the latched RA 442 of FIG. 4A.

At block 510, the memory device 200 can store the defect locations for repairing the defective memory cells. The memory device 200 can store the defect locations, such as by setting fuses and/or writing to other non-volatile memory. In storing the defect locations, the memory device 200 can store both the repair address and the bank information for each defective memory cell or each grouping thereof. For example, at block 512, the memory device 200 can store the bank information in a first set of fuses associated with a repair. Also, at block 514, the memory device 200 can store the repair address in a second set of fuses that is paired with the first set of fuses and associated with the same repair.

The stored location information of the defective memory cells can be used for repairs, such as by accessing/utilizing redundant memory cells in place of the defective memory cells. As an illustrative example, the memory device 200 can load the stored repair addresses and the stored bank information into the corresponding latches (e.g., the shared latches 412) during initialization or power reset. When memory operations (e.g., activate operations) reference or target rows including the defective memory cells, the memory device 200 can use or access the redundant rows associated with the defective memory cells.

At block 552, the memory device 200 can issue/receive an active command (ACT). Based on the active command, the memory device 200 can activate an idle bank, thereby causing a sense of that row into the bank's array of column sense amplifiers. In other words, the memory device 200 can issue the active command to open the row. The activate command may be provided by an external source. The activate command may include the row address (e.g., the external RA 422, the External BA 424, and/or the BG identifier 426) associated with the commanded operation.

At block 554, the memory device 200 can obtain latched information (e.g., the latched RA 442 and/or the latched BA 443). The memory device 200 can obtain the information based on providing the latched information to the subsequent circuits, such as the shared match circuit 414 or the row match circuits 452 of FIG. 4B therein.

At block 562, the memory device 200 can begin implementing an operation (e.g., an activate operation) in response to a command from a host. At block 564, the memory device 200 can compare the operational address (e.g., the target address) to the latched address information. For example, the memory device 200 can use the row match circuits 452 to compare the external RA 422 and the External BA 424 for the operation to the latched RAs and the latched BAs, respectively, that are loaded into the shared latches 412. As described above, the row match circuits 452 can generate the row match flags 444 of FIG. 4B for representing the results of the comparisons. For example, the row match circuits 452 can activate the row match flag when the corresponding latched RA 442 and the corresponding latched BA 443 match the external RA 422 and the External BA 424, respectively.

At block 566, the memory device 200 can internally (e.g., within the shared match circuit 414) generate the match results. For example, the shared match circuit 414 can generate the combined match output 446 of FIG. 4B based on grouping the set of generated row match flags 444. The combined match output 446 can be provided to the encoder 454 and/or the repair detection circuit 456. Accordingly, the encoder 454 can internally generate the redundant address (e.g., an address or an identifier for a repair row associated with the defective row targeted by the operation). Also, the repair detection circuit 456 can internally generate an active-repair flag as an indication whether the bank/row address of the operation matches at least one of the latched bank/row address.

At block 568, the memory device 200 can generate the match results according to bank information. For example, based on the internally generated redundant address, the bank selection circuit 458 of FIG. 4B can generate the match results that include either the first redundant address 432 of FIG. 4B for the first bank 406 or the second redundant address 436 of FIG. 4B for the second bank 408. Also, based on the internally generated active-repair flag, the bank selection circuit 458 can generate the match results that include either the first active-repair flag 434 of FIG. 4B for the first bank 406 or the second active-repair flag 438 of FIG. 4B for the second bank 408. In other words, the bank selection circuit 458 can communicate the match results (e.g., the internally generated address/flag) to the bank targeted by the operation (e.g., the bank indicated by the External BA 424). Accordingly, when the operational address matches the address loaded in the latches shared by a group of banks, the bank selection circuit 458 can implement the repair for the targeted of bank without duplicating the repairs across of the group of banks. The processes for the activate command may end after generating the match result, and the memory device 200 may proceed with the replaced repair.

Figure 6:
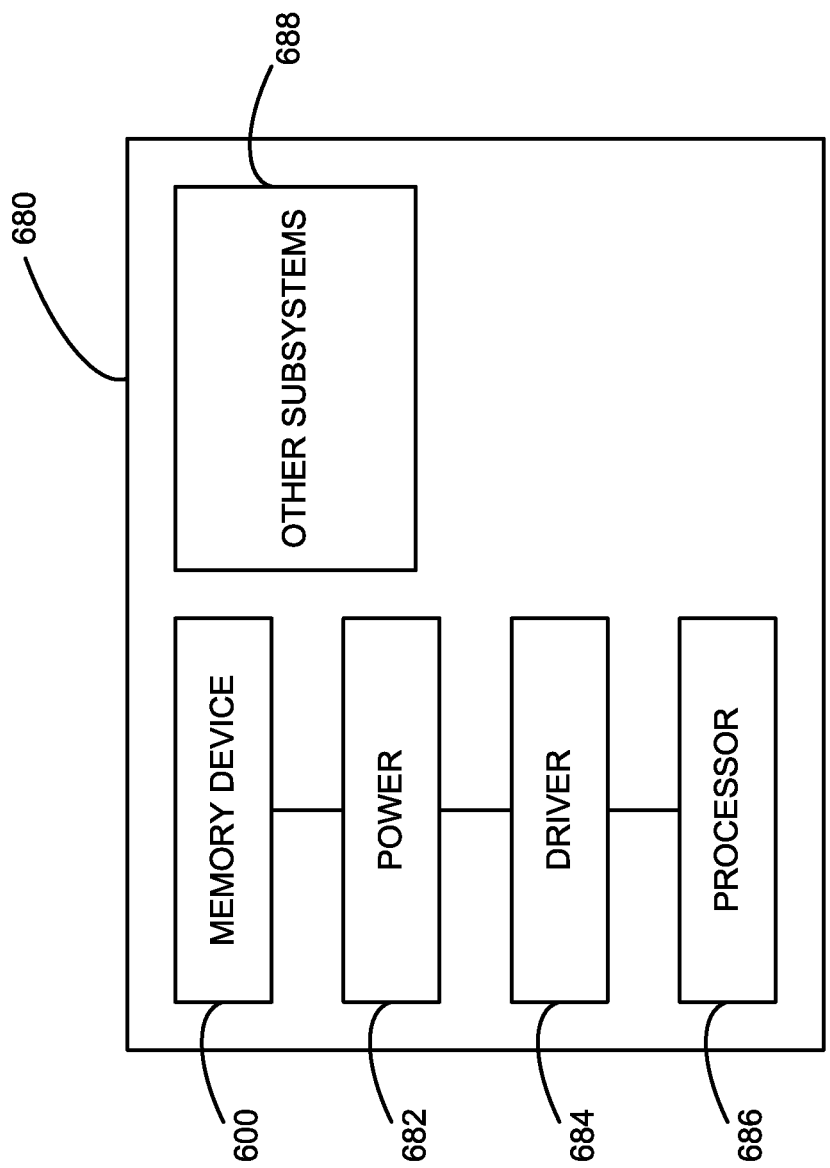
FIG. 6 is a schematic view of a system that includes an apparatus in accordance with an embodiment of the present technology.

FIG. 6 is a schematic view of a system that includes an apparatus in accordance with embodiments of the present technology. Any one of the foregoing apparatuses (e.g., memory devices) described above with reference to FIGS. 2-5 can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the apparatus described above with reference to FIGS. 2-5, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 2-6.

We claim:

1. A memory device, comprising:
    a memory array including a plurality of memory banks that each include (1) a plurality of memory cells and (2) a plurality of redundant cells configured to replace one or more target memory cells in the plurality of memory cells;
    shared latches configured to latch a latched row address (RA) for a row repair, wherein the latched RA identifies a target row that includes the target memory cells;
a shared match circuit coupled to the set of shared latches and the plurality of memory banks, the shared match circuit configured to—
receive an external RA and an external bank address (BA) associated with an operation; and
identify a repair row based on the external RA, the external BA, and the latched RA,
wherein the repair row corresponds to the target row within the bank for implementing a row repair for the plurality of memory banks, and
wherein the repair row includes at least a portion of the plurality of redundant cells.

2. The memory device of claim 1, wherein the shared match circuit is configured to identify the repair row specific to the corresponding activated bank and without duplicating the row repair across the plurality of memory banks.

3. The memory device of claim 1, wherein the shared match circuit is configured to identify the repair row for duplicating the row repair across the plurality of memory banks.

4. The memory device of claim 1, wherein the shared match circuit is configured to identify the repair row based on:
comparing the external RA to the latched RA; and
directing a match result thereof according to the external BA.

5. The memory device of claim 1, wherein:
the shared latches are configured to latch a latched bank address (BA) for the row repair in addition to the latched RA, the latched BA representing a target bank within the plurality of memory banks that includes the target memory cells; and
the shared match circuit is configured to:
receive an external BA associated with the operation; and
identify the repair row based on comparing the external RA and the external BA to the latched RA and the latched BA, respectively.

6. The memory device of claim 5, wherein:
the shared latches include sets of latches, wherein each set of latches are each configured to store the latched RA and the latched BA corresponding to one row repair;
the shared match circuit includes row match circuits that are each coupled to a unique set of the latches, the row match circuits each configured to—
compare the corresponding latched BA to the external BA;
compare the corresponding latched RA to the external RA; and
generate a row match flag according to the comparisons.

7. The memory device of claim 6, wherein each of the row match circuits is an XNOR device configured to activate the row match flag when the corresponding latched BA and the corresponding latched RA match the external BA and the external RA, respectively.

8. The memory device of claim 6, wherein each of the row match circuits is a non-CMOS device configured to precharge the row match flag high before comparing the corresponding latched BA and the corresponding latched RA to the external BA and the external RA, respectively.

9. The memory device of claim 8, wherein the non-CMOS device configured is configured to pull the row match flag low when the corresponding latched BA and/or the corresponding latched RA differ from the external BA and the external RA, respectively.

10. The memory device of claim 6, wherein the shared match circuit includes:
an encoder coupled to the row match circuits, the encoder configured to generate a combined match output based on the row match flags, wherein the combined match output identifies the repair row; and
a bank selection circuit coupled to the encoder, the bank selection circuit configured to provide the combined match output to a bank associated with the operation according to the external BA.

11. The memory device of claim 10, wherein the encoder is configured receive a first number of row binary match flags and generate the combined match output including a second number of bits, wherein the first number is greater than the second number.

12. The memory device of claim 10, wherein the bank selection circuit includes a set of high-Z buffers configured to transmit the combined match output according to the external BA, wherein each high-Z buffer is coupled to a corresponding bank in the plurality of memory banks.

13. The memory device of claim 10, wherein the bank selection circuit includes a multiplexor coupled to the plurality of memory banks, the multiplexor configured to provide the combined match output to a bank indicated by the external BA.

14. The memory device of claim 6, wherein the shared match circuit includes:
a repair detection circuit coupled to the row match circuits, the repair detection circuit configured to generate an active-repair flag based on the row match flags, wherein the active-repair flag indicates whether the operation is associated with a row repair represented in the set of latches; and
a bank selection circuit coupled to the repair detection circuit, the bank selection circuit configured to provide the active-repair flag for a bank associated with the operation according to the external BA.

15. The memory device of claim 14, wherein the repair detection circuit is an OR device configured to activate the active-repair flag when one or more of the row match flags indicate that the corresponding latched BA and the corresponding latched RA match the external BA and the external RA, respectively.

16. The memory device of claim 6, further comprising a set of latches coupled to the shared match circuit and the plurality of memory banks, the set of latches configured to store the row match flag and/or one or more processing results thereof across activate commands for providing access to the stored data by the plurality of memory banks, wherein the set of latches are configured to reset based on precharging one or more of the plurality of memory banks.

17. The memory device of claim 1, wherein:
the memory array includes a first bank and a second bank;
the external RA and the external BA indicates the first bank;
the shared match circuit is configured to identify the repair row in the first bank according to the external RA and the external BA.

18. The memory device of claim 17, further comprising:
a first row decoder coupled to the first bank;
a second row decoder coupled to the second bank;
a first bank logic coupled to the first row decoder and the shared match circuit, wherein the first bank logic is configured to implement memory operations for the first bank through the first row decoder; and a second bank logic coupled to the second row decoder and the shared match circuit, wherein the second bank logic is configured to implement memory operations for the second bank through the second row decoder.

19. A method of operating a memory device that includes a plurality of memory cells and a plurality of redundant cells configured to replace one or more target memory cells in the plurality of memory cells, the method comprising:

obtaining a latched row address (RA) representing a location of the one or more target memory cells within a bank;

receiving an operating address for a memory operation, wherein the operating address includes (1) an external bank address (BA) that identifies a bank associated with the memory operation and (2) an external RA that identifies a row within the bank associated with the memory operation;

identifying a repair row based on comparing the external RA to the latched RA,
wherein the repair row corresponds to a row for implementing a row repair for the plurality of memory banks, and
wherein the repair row includes at least a portion of the plurality of redundant cells; and replacing the target row according to the external BA using the identified repair row.

20. The method of claim 19, wherein replacing the target row includes replacing the target row of the corresponding bank and without duplicating the row repair across the grouped set of banks.

21. The method of claim 19, wherein replacing the target row includes communicating a redundant address that identifies the repair row to a bank indicated by the external BA.

22. The method of claim 19, further comprising:
obtaining a latched bank address (BA) representing a bank within the memory array that includes the one or more target memory cells, wherein the latched BA indicates one bank from a grouped set of banks that share a set of repair latches;
wherein:
the latched RA represents a row within the bank represented by the latched BA; and
identifying the repair row includes comparing the external BA to the latched BA, wherein the repair row corresponds to a target row within the bank represented by the latched BA and the external BA.

23. The method of claim 19, wherein replacing the target row includes communicating an active-repair flag to the corresponding bank according to the external BA, wherein the active-repair flag indicates that the external BA matched a latched bank address (BA) and/or the external RA matched the latched RA stored in the shared set of repair latches.

24. The method of claim 19, further comprising:
detecting one or more defective memory cells, wherein the one or more defective memory cells comprise the target memory cells;
identifying the bank within the memory array that includes the one or more defective memory cells;
storing, via a first non-volatile memory, a bank identifier corresponding to the identified bank, wherein the bank identifier further corresponds to the latched BA for an instance of the row repair;
identifying the target row that includes the one or more defective memory cells, wherein the target row is in the identified bank; and
storing, via a first non-volatile memory, an address corresponding to the target row, wherein the address further corresponds to the latched RA for the instance of the row repair.

25. The method of claim 24, further comprising:
accessing the bank identifier and the address from the first and second non-volatile memory;
broadcasting the bank identifier and the address;
loading the bank identifier into a first set of latches within a set of shared latches; and
loading the address into a second set of latches within the set of shared latches, wherein the first and second sets of latches represent one instance of the row repair.

* * * * *